(12) United States Patent
Forbes et al.

(10) Patent No.: US 6,251,470 B1
(45) Date of Patent: *Jun. 26, 2001

(54) METHODS OF FORMING INSULATING MATERIALS, AND METHODS OF FORMING INSULATING MATERIALS AROUND A CONDUCTIVE COMPONENT

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/948,372

(22) Filed: Oct. 9, 1997

(51) Int. Cl.[7] .................................................. B05D 5/12
(52) U.S. Cl. ........................... 427/97; 427/344; 427/387; 427/419.2; 438/409; 438/623; 438/787; 438/960
(58) Field of Search ................................... 438/787, 790, 438/960, 409, 603; 427/96, 99, 387, 250, 344, 419.2

(56) References Cited

U.S. PATENT DOCUMENTS

| | | |
|---|---|---|
| 3,919,060 | 11/1975 | Pogge et al. . |
| 3,954,523 | 5/1976 | Magdo et al. ...................... 148/175 |
| 3,979,230 | 9/1976 | Anthony et al. . |
| 3,998,662 | 12/1976 | Anthony et al. . |
| 4,063,901 | * 12/1977 | Shiba ..................................... 29/578 |
| 4,180,416 | * 12/1979 | Brock .................................... 148/1.5 |
| 4,561,173 | 12/1985 | Te Velde . |
| 5,023,200 | 6/1991 | Blewer et al. ........................ 437/187 |

(List continued on next page.)

OTHER PUBLICATIONS

Anderson, R.C. et al., "Porous polycrystalline silicon: A new material for MEMS", Journal of Microelectromechanical systems, vol. 3, No. 1, pp. 10–18, Mar. 1994.*

Low Dielectric Constant Materials and Methods for Interlayer Dielectric Films in Ultralarge–Scale Integrated Circuit Multilevel Interconnections, Tetsuya Homma, *Materials Science &Engr.*, R23, pp. 243–285 (1998).

Product Brochure and Material Safety Data Sheet,*Interlayer Dielectric*, *JSR Microelectronics*, 12 pages (1997).

Abstract: SiLK Polymer Coating With Low Dielectric Constant and High Thermal Stability for ULSI Interlayer Dielectric, P.H. Townsend et al., *The Dow Chemical Company*, Midland, MI, 9 pages (Undated).

U.S. application No. 08/947,847, Juengling et al., filed Oct. 9, 1997.

Singer, Peter, "The New Low–k Candidate: It's a Gas", (Technology News/Wafer Processing) *Semiconductor International*, 1 Page, (Mar. 1989).

Silicon Processing for the VLSI Era— vol. 1: Process Technology, Wolf, Ph.D., et al., Lattice Press ©1986, pp. 429–437.

(List continued on next page.)

*Primary Examiner*—Brian K. Talbot
(74) *Attorney, Agent, or Firm*—Wells, St. John, Roberts, Gregory & Matkin P.S.

(57) ABSTRACT

In one aspect, the invention encompasses a method of forming an insulating material around a conductive component. A first material is chemical vapor deposited over and around a conductive component. Cavities are formed within the first material. After the cavities are formed, at least some of the first material is transformed into an insulative second material. In another aspect, the invention encompasses a method of forming an insulating material. Polysilicon is deposited proximate a substrate. A porosity of the polysilicon is increased. After the porosity is increased, at least some of the polysilicon is transformed into silicon dioxide.

10 Claims, 2 Drawing Sheets

U.S. PATENT DOCUMENTS

| | | |
|---|---|---|
| 5,103,288 | 4/1992 | Sakamoto et al. . |
| 5,141,896 | 8/1992 | Katoh . |
| 5,171,713 | 12/1992 | Matthews . |
| 5,192,834 | 3/1993 | Yamanishi et al. . |
| 5,461,003 | 10/1995 | Havemann et al. . |
| 5,470,801 | 11/1995 | Kapoor et al. ............ 437/238 |
| 5,488,015 * | 1/1996 | Havermann et al. ........ 437/195 |
| 5,496,773 | 3/1996 | Rhodes et al. . |
| 5,525,857 | 6/1996 | Gnade et al. . |
| 5,527,737 | 6/1996 | Jeng . |
| 5,554,567 | 9/1996 | Wang . |
| 5,583,078 | 12/1996 | Osenbach . |
| 5,599,745 | 2/1997 | Reinberg . |
| 5,629,238 | 5/1997 | Choi et al. . |
| 5,670,828 | 9/1997 | Cheung et al. . |
| 5,691,565 | 11/1997 | Manning . |
| 5,691,573 | 11/1997 | Avanzino et al. . |
| 5,736,425 | 4/1998 | Smith et al. . |
| 5,744,399 | 4/1998 | Rostoker et al. . |
| 5,773,363 | 6/1998 | Derderian et al. . |
| 5,804,508 | 9/1998 | Gnade et al. . |
| 5,807,607 | 9/1998 | Smith et al. . |
| 5,861,345 | 1/1999 | Chou et al. . |
| 5,882,978 | 3/1999 | Srinivasan et al. . |
| 5,883,014 | 3/1999 | Chen et al. . |
| 5,950,102 | 9/1999 | Lee . |
| 6,001,747 | 12/1999 | Annapragada . |
| 6,028,015 | 2/2000 | Wang et al. . |

OTHER PUBLICATIONS

The New IEEE Standard Dictionary of Electrical and Electronics Terms, ©1993 IEEE, Inc., p. 662. Jan. 15, 1993.

Silicon Processing For The VLSI ERA, by Stanley Wolf Ph.D., ©1986 Lattice Press pp. 1–8. No month available.

Togo, M., "A Gate–side Air–gap Structure (GAS) to Reduce the Parasitic Capacitance in MOSFETs", 1996 Sympos. on VLSI Technology Digest of Technical Papers, IEEE No month available 1996, pp. 38–39.

Anand, M.B., "Nura: A Feasible, Gas–Dielectric Interconnect Process", 1996 Sympos. on VLSI Technology Digest of Technical Papers, IEEE No month available 1996, PP. 82–83.

Watanabe, H., "A Novel Stacked Capacitor with Porous–Si Electrodes for High Density DRAMs", Microelectronics Research Laboratories, NEC Corp., date unknown, pp. 17–18.

Abstract: Anderson, R.C. et. al., "Porous Polycrystalline Silicon: A New Material For MEMS", Jnl. of Microelectromechanical Systems (Mar. 1994), vol. 3, No. 1, pp. 10–18.

* cited by examiner

METHODS OF FORMING INSULATING MATERIALS, AND METHODS OF FORMING INSULATING MATERIALS AROUND A CONDUCTIVE COMPONENT

TECHNICAL FIELD

The invention pertains to methods of forming insulating material, such as for example, methods of forming insulating material between components of integrated circuits.

BACKGROUND OF THE INVENTION

In methods of forming integrated circuits, it is frequently desired to isolate components of the integrated circuits from one another with insulative material. Such insulative material may comprise a number of materials, including, for example, silicon dioxide, silicon nitride, and undoped semi-conductive material, such as silicon. Although such materials have acceptable insulative properties in many applications, the materials disadvantageously have high dielectric constants which can lead to capacitive coupling between proximate conductive elements. For instance, silicon dioxide has a dielectric constant of about 4, silicon nitride has a dielectric constant of about 8, and undoped silicon has a dielectric constant of about 12.

It would be desirable to develop alternative methods for insulating conductive elements from one another with low-dielectric-constant materials.

SUMMARY OF THE INVENTION

The invention encompasses methods of forming insulating materials proximate conductive elements.

In one aspect, the invention encompasses a method of forming an insulating material proximate a substrate in which a first material is chemical vapor deposited proximate the substrate. Cavities are formed within the first material, and, after forming the cavities, at least some of the first material is transformed into an insulative second material.

In another aspect, the invention encompasses a method of forming an insulating material proximate a substrate in which porous polysilicon is formed proximate the substrate and at least some of the porous polysilicon is transformed into porous silicon dioxide.

In yet another aspect, the invention encompasses a method of forming an insulating material between components of an integrated circuit. Polysilicon is chemical vapor deposited between two components and electrochemically anodized to convert the polysilicon into a porous mass having a first volume. The first volume comprises a polysilicon volume and a cavity volume, with the cavity volume comprising greater than or equal to about 75% of the first volume. The porous polysilicon mass is oxidized to transform the polysilicon into porous silicon dioxide having a second volume. The second volume comprises a silicon dioxide volume and a cavity volume, with the cavity volume comprising less than or equal to about 50% of said second volume.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
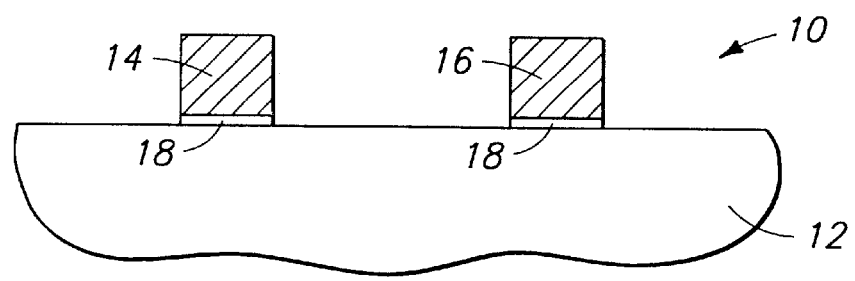
FIG. 1 is a diagrammatic cross-sectional view of a semiconductor wafer fragment at a preliminary step of a processing method of the present invention.

FIG. 1 shows a semiconductive wafer fragment 10 at a preliminary processing step of the present invention. Wafer fragment 10 comprises a substrate 12 and conductive elements 14 and 16 overlying substrate 12. Substrate 12 may comprise, for example, a monocrystalline silicon wafer. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Conductive elements 14 and 16 may comprise, for example, conductive lines. Conductive elements 14 and 16 might be part of an integrated circuit, for example. Although conductive elements 14 and 16 are illustrated as being horizontally displaced, such elements could also be displaced along a non-horizontal axis. For example, such elements could be vertically displaced from one another.

An insulative material 18 is formed between substrate 12 and conductive elements 14 and 16. Insulative material 18 can comprise a number of materials known to persons of ordinary skill in the art, such as, for example, silicon nitride and silicon dioxide. Insulative material 18 is provided to electrically isolate conductive elements 14 and 16 from substrate 12. Such electrical isolation might be desired, for example, if substrate 12 is conductive or semiconduc:tive.

Figure 2:
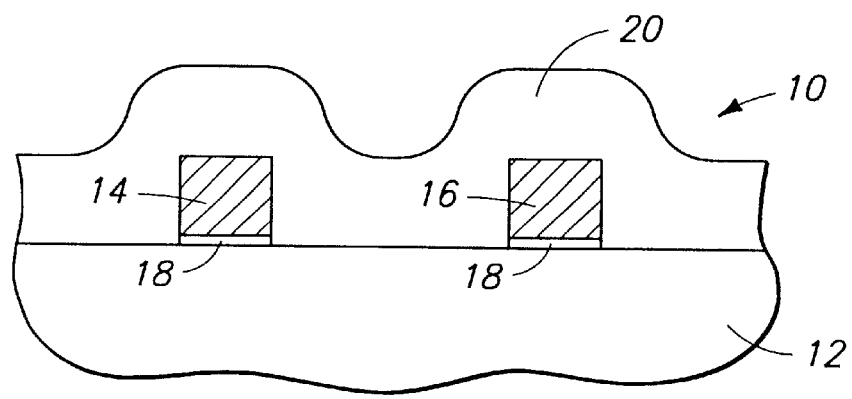
FIG. 2 is a view of the FIG. 1 wafer fragment shown at a processing step subsequent to that of FIG. 1.

Referring to FIG. 2, a first material 20 is deposited proximate substrate 12 and between conductive elements 14 and 16. First material 20 preferably comprises polysilicon, and is preferably formed by chemical vapor depositing. Methods for chemical vapor depositing polysilicon are known to persons of ordinary skill in the art, and include, for example, methods comprising thermal decomposition of silane.

Figure 3:
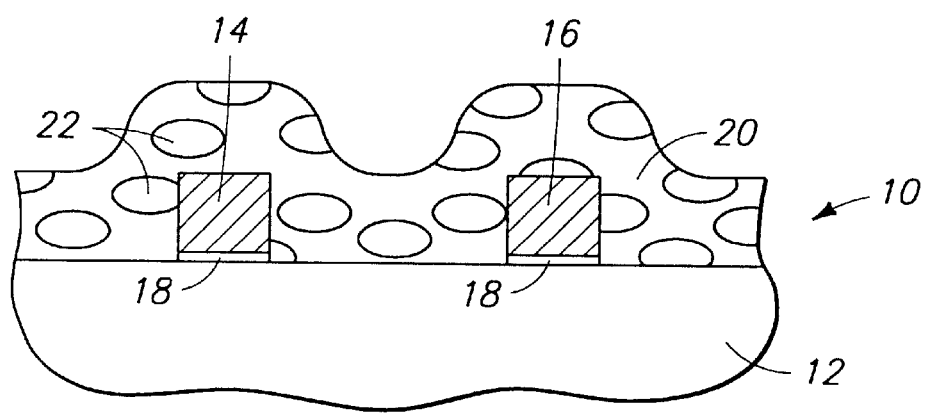
FIG. 3 is a view of the FIG. 1 wafer fragment shown at a processing step subsequent to that of FIG. 2.

Referring to FIG. 3, cavities 22 are formed within first material 20. The formation of cavities 22 within first material 20 converts first material 20 into a porous first material. In a preferred example in which first material 20 comprises polysilicon, cavities 22 may be formed by, for example, either electrochemical anodization or by subjecting the polysilicon to a chemical etch. An example method of electrochemical anodization comprises doping preferred polysilicon layer 20 and making wafer fragment 10 an anode in an aqueous hydrofluoric acid solution. The hydrofluoric acid solution can comprise, for example, 20 wt. % HF, and the amount of current applied with wafer fragment 10 as anode can comprise, for example, about 10 mA for a 100 mm diameter wafer. An example method of chemical etching comprises doping preferred polysilicon layer 20 with a p-type conductivity-enhancing dopant and subsequently chemically etching layer 20 with a phosphoric acid solution.

Preferably, greater than about 50% of a volume of layer 20 will be removed in forming cavities 22. More preferably, at least about 75% of a volume of layer 20 will be removed in forming cavities 22. In other words, the formation of cavities 22 converts the first material of layer 20 into a porous mass having a first volume which comprises a polysilicon volume and a cavity volume, wherein the cavity volume is most preferably greater than or equal to about 75% of the first volume.

Figure 4:
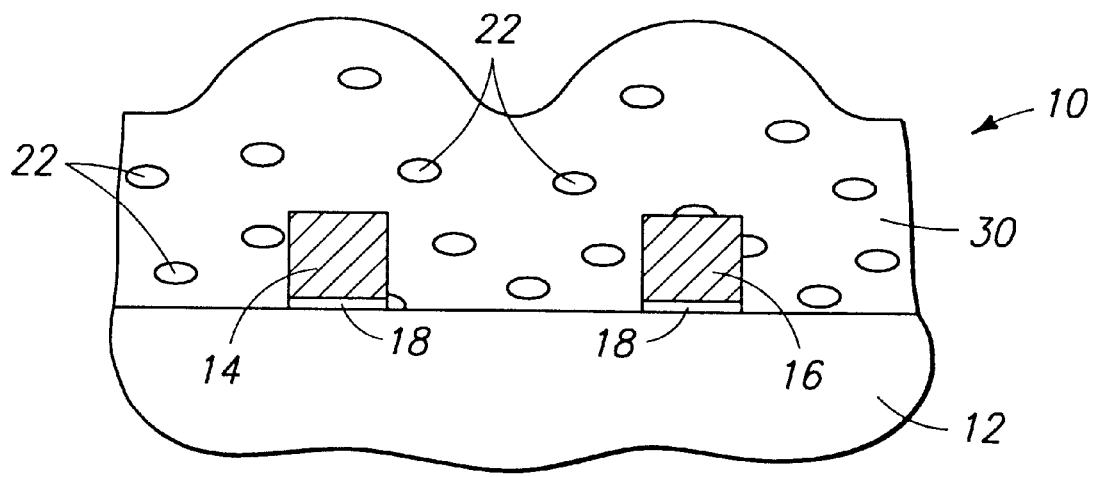
FIG. 4 is a view of the FIG. 1 wafer fragment shown at a processing step subsequent to that of FIG. 3.

Referring to FIG. 4, first material 20 (shown in FIG. 3) is transformed into an insulative second material 30. Where the first material 20 comprises polysilicon, such transformation can occur, for example, by oxidizing polysilicon layer 20 to transform such polysilicon layer to a silicon dioxide layer 30. Methods for oxidizing a polysilicon layer are known to persons of ordinary skill in the art, and include, for example, thermal oxidation utilizing one or more of the oxygen-containing compounds $O_2$, $O_3$ and $H_2O$. In the shown embodiment, substantially all of first material 20 is transformed into insulative second material 30. However, it is to be understood that the invention also encompasses embodiments in which only some of first material 20 is transformed into insulative second material 30. In the shown preferred embodiment, oxidation of polysilicon layer 20 (shown in FIG. 3) having a first volume swells the layer into a silicon dioxide layer 30 having a second volume which is larger than the first volume. The increase in volume of layer 30 relative to layer 20 changes the relative volume occupied by cavities 22. For instance, in an example embodiment in which cavities 22 comprise a cavity volume greater than or equal to about 75% of a first volume of porous polysilicon layer 20 (shown in FIG. 3), the cavity volume can comprise less than or equal to about 50% of a volume of porous silicon dioxide layer 30 formed by oxidizing such layer 20.

The cavities 22 within second material layer 30 lower a dielectric constant of the material relative to what the dielectric constant would be in the absence of cavities 22. Cavities 22 will preferably be filled with some gas. Gases typically have a dielectric constant of about 1, which is less than a dielectric constant of most commonly used insulative materials. For instance, if the insulative solid material of layer 30 comprises silicon dioxide, the silicon dioxide will typically have a dielectric constant of about 4. The addition of cavities 22 within material layer 30 decreases the dielectric constant of the material 30 to less than 4. In the above-described embodiment in which cavities 22 comprise about 50% of the total volume of layer 30, and in which layer 30 comprises silicon dioxide, layer 30 can have a dielectric constant of about 1.6. Accordingly, the method of the present invention can form a porous silicon dioxide insulative layer having a dielectric 1 constant of less than or equal to about 1.6.

Figure 5:
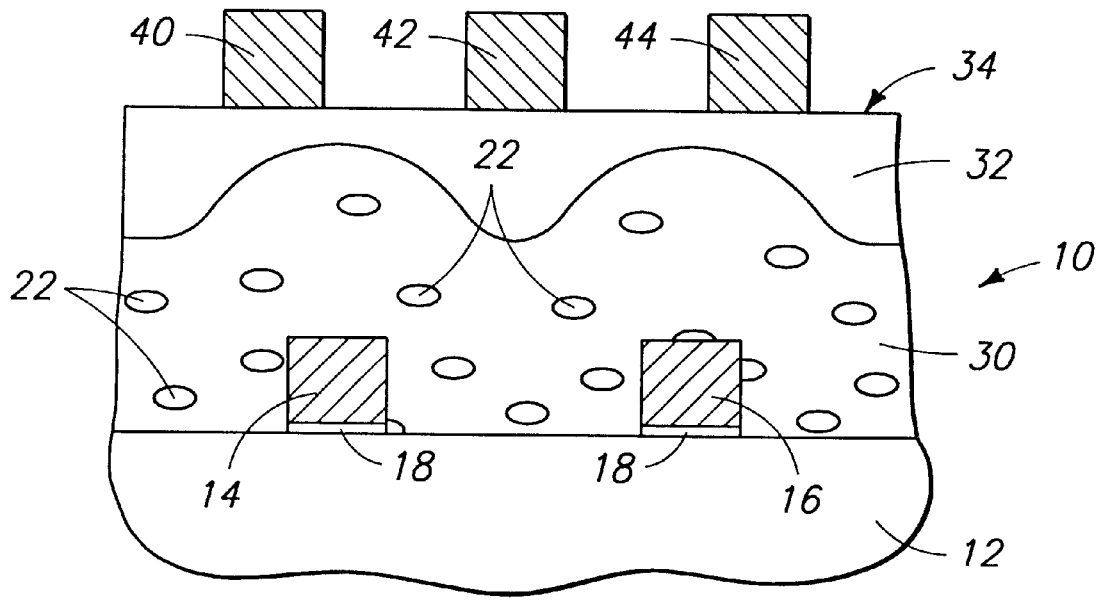
FIG. 5 is a view of the FIG. 4 wafer fragment shown at a processing step subsequent to that of FIG. 4.

As shown in FIG. 5, layer 30 can be utilized to support additional circuitry formed over conductive elements 14 and 16. In the shown embodiment, a filling layer 32 is provided over layer 30. Filling layer 32 can comprises any of a number of materials known to persons of ordinary skill in the art, including, for example, insulative materials such as silicon dioxide or silicon nitride. Filling layer 32 can be provided by, for example, chemical vapor deposition. Filling layer 32 is planarized, such as, for example, by chemical-mechanical polishing, to form a substantially planar upper surface 34.

After forming a planar upper surface 34 over layer 30, circuit elements 40, 42 and 44 are formed over the upper surface. Circuit elements 40, 42 and 44 can be formed by conventional methods.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an insulating material comprising:
    depositing polysilicon proximate a substrate;
    forming cavities within the polysilicon to enhance porosity of the polysilicon; and
    after forming the cavities, transforming the polysilicon into porous silicon dioxide.

2. A method of forming an insulating material, comprising:
    forming polysilicon proximate a substrate;
    forming cavities within the polysilicon to enhance porosity of the polysilicon;
    after forming the cavities, transforming the polysilicon into porous silicon dioxide; and
    forming at least one structure over the porous silicon dioxide.

3. The method of claim 1 wherein the porous silicon dioxide comprises a volume, wherein the cavities comprise a cavity volume, and wherein the cavity volume is less than or equal to about 50% of the volume of the porous silicon dioxide.

4. The method of claim 2 wherein the formed polysilicon has a first volume before forming cavities, and wherein the forming cavities removes greater than about 50% of said first volume of the formed polysilicon.

5. The method of claim 2 wherein the forming polysilicon comprises chemical vapor deposition.

6. The method of claim 1 wherein the forming cavities comprises electrochemical anodization.

7. The method of claim 1 wherein the forming cavities comprises subjecting the polysilicon to a chemical etch.

8. The method of claim 1 wherein the forming cavities comprises:
    doping the polysilicon with a p-type dopant; and
    subjecting the doped polysilicon to a phosphoric acid etch.

9. The method of claim 1 wherein the porous silicon dioxide comprises a dielectric constant of less than 4.

10. The method of claim 1 wherein the porous silicon dioxide comprises a dielectric constant of less than or equal to about 1.6.

* * * * *

UNITED STATES PATENT AND TRADEMARK OFFICE
CERTIFICATE OF CORRECTION

PATENT NO.  : 6,251,470 B1
DATED       : June 26, 2001
INVENTOR(S) : Leonard Forbes Page 1 of 1

It is certified that error appears in the above-identified patent and that said Letters Patent is hereby corrected as shown below:

Column 1,
Line 28, delete "die lectric-constant" and insert -- dielectric-constant --.

Column 3,
Line 57, delete "dielectric 1 constant" and insert -- dielectric constant --.

Signed and Sealed this

First Day of January, 2002

Attest:

Attesting Officer

JAMES E. ROGAN
Director of the United States Patent and Trademark Office